US011804691B2

(12) United States Patent
Schubert et al.

(10) Patent No.: US 11,804,691 B2
(45) Date of Patent: *Oct. 31, 2023

(54) SYSTEMS AND METHODS FOR DESIGNING OPTICAL DEVICES HAVING MODE SELECTIVE FACETS

(71) Applicant: X Development LLC, Mountain View, CA (US)

(72) Inventors: Martin Friedrich Schubert, Mountain View, CA (US); Brian John Adolf, San Mateo, CA (US); Jesse Lu, East Palo Alto, CA (US)

(73) Assignee: X Development LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/321,337

(22) Filed: May 14, 2021

(65) Prior Publication Data

US 2021/0305767 A1    Sep. 30, 2021

Related U.S. Application Data

(63) Continuation of application No. 16/555,454, filed on Aug. 29, 2019, now Pat. No. 11,011,884.

(51) Int. Cl.
*H01S 5/00* (2006.01)
*H01S 5/34* (2006.01)
(Continued)

(52) U.S. Cl.
CPC .......... *H01S 5/0035* (2013.01); *H01S 5/0285* (2013.01); *H01S 5/0287* (2013.01);
(Continued)

(58) Field of Classification Search
CPC .... H01S 5/0035; H01S 5/0285; H01S 5/0287; H01S 5/065; H01S 5/0651; H01S 5/1003;
(Continued)

(56) References Cited

U.S. PATENT DOCUMENTS 6,356,681 B1    3/2002    Chen
6,408,119 B1    6/2002    Meltz et al.
(Continued)

OTHER PUBLICATIONS

Mauricio et al., "Design Framework for metasurface optics-based convolutional neural networks," Applied Optics, May 2021, 60(15):4356-4365.
(Continued)

*Primary Examiner* — Kinam Park
(74) *Attorney, Agent, or Firm* — Fish & Richardson P.C.

(57) ABSTRACT

Methods for designing a mode-selective optical device including one or more optical interfaces defining an optical cavity include: defining a loss function within a simulation space encompassing the optical device, the loss function corresponding to an electromagnetic field having an operative wavelength within the optical device resulting from an interaction between an input electromagnetic field at the operative wavelength and the one or more optical interfaces of the optical device; defining an initial structure for each of the one or more optical interfaces, each initial structure being defined using a plurality of voxels; determining values for at least one structural parameter and/or at least one functional parameter of the one or more optical interfaces by solving Maxwell's equations; and defining a final structure of the one or more optical interfaces based on the values for the one or more structural and/or functional parameters.

19 Claims, 6 Drawing Sheets

(51) Int. Cl.
  H01S 5/028 (2006.01)
  H01S 5/20 (2006.01)
  H01S 5/22 (2006.01)
  H01S 5/10 (2021.01)
  H01S 5/32 (2006.01)
  H01S 5/065 (2006.01)

(52) U.S. Cl.
  CPC ............ *H01S 5/065* (2013.01); *H01S 5/0651* (2013.01); *H01S 5/1003* (2013.01); *H01S 5/1028* (2013.01); *H01S 5/20* (2013.01); *H01S 5/2027* (2013.01); *H01S 5/2031* (2013.01); *H01S 5/22* (2013.01); *H01S 5/32* (2013.01); *H01S 5/34* (2013.01); *H01S 2301/16* (2013.01)

(58) Field of Classification Search
  CPC ........ H01S 5/1028; H01S 5/20; H01S 5/2027; H01S 5/2031; H01S 5/22; H01S 5/32; H01S 5/34; H01S 2301/16
  See application file for complete search history.

(56) References Cited

U.S. PATENT DOCUMENTS

| | | | |
|---|---|---|---|
| 6,456,762 | B1 | 9/2002 | Nishiki |
| 6,477,194 | B1* | 11/2002 | Eng ........................ H01S 5/1228 372/45.01 |
| 6,681,067 | B1 | 1/2004 | Kersey |
| 6,768,850 | B2 | 7/2004 | Dugan et al. |
| 6,847,762 | B2 | 1/2005 | Sweetser et al. |
| 6,946,684 | B2* | 9/2005 | Shigihara ................ H01S 5/028 257/79 |
| 6,956,994 | B2 | 10/2005 | Bernard |
| 8,380,027 | B2 | 2/2013 | Reed |
| 10,592,732 | B1 | 3/2020 | Sather et al. |
| 11,011,884 | B1* | 5/2021 | Schubert ............... H01S 5/1003 |
| 11,092,746 | B1 | 8/2021 | Adolf et al. |
| 11,604,957 | B1 | 3/2023 | Schubert et al. |
| 2003/0186142 | A1 | 10/2003 | Deshmukh et al. |
| 2004/0028104 | A1* | 2/2004 | Buda .................... H01S 5/04252 372/46.01 |
| 2004/0196884 | A1* | 10/2004 | Ohkubo .................. B82Y 20/00 372/96 |
| 2005/0226558 | A1 | 10/2005 | Kim et al. |
| 2006/0078258 | A1 | 4/2006 | Anisimov et al. |
| 2008/0013581 | A1* | 1/2008 | Kobayashi ............ H01S 5/2231 372/45.013 |
| 2008/0089374 | A1* | 4/2008 | Eichler ..................... H01S 5/22 372/45.01 |
| 2010/0142566 | A1* | 6/2010 | Liu ......................... B82Y 20/00 372/18 |
| 2011/0102799 | A1 | 5/2011 | Matejka et al. |
| 2016/0012176 | A1 | 1/2016 | Liu et al. |
| 2016/0164260 | A1* | 6/2016 | Chua ..................... H01S 5/3213 372/45.01 |
| 2017/0024356 | A1 | 1/2017 | Angerer |
| 2017/0179680 | A1* | 6/2017 | Mahgerefteh ........ G02B 6/1228 |
| 2018/0024297 | A1 | 1/2018 | Bovington et al. |
| 2018/0045953 | A1 | 2/2018 | Fan et al. |
| 2018/0053334 | A1 | 2/2018 | Schneider |
| 2019/0097722 | A1* | 3/2019 | McLaurin ........... H01S 5/02251 |
| 2019/0179016 | A1* | 6/2019 | Raring .................. H01S 5/0087 |
| 2019/0207362 | A1* | 7/2019 | Kong ........................ G02B 6/34 |
| 2020/0050715 | A1 | 2/2020 | Krishnannurthy et al. |
| 2020/0226221 | A1* | 7/2020 | Lu ........................... G06F 30/23 |
| 2021/0007702 | A1 | 1/2021 | Lee et al. |

OTHER PUBLICATIONS

Sitzmann et al., "End-to-end Optimization of Optics and Image Processing for Achromatic Extended Depth of Field and Super-resolution Imaging," ACM Trans. Graph., Aug. 2018, 37(4):1-13.

Bernhardi, "Fourteen Philosophy Thesis Topic Ideas for University Students," Dissertation for the degree of Doctor University of Twente, Integrated Optical MicroSystems (IOMS) group, Faculty of Electrical Engineering, Mathematics and Computer Science, MESA+ Institute for Nanotechnology, Apr. 1982, 169pages.

Frei et al., "Topology optimization of a photonic crystal waveguide termination to maximize directional emission," Appl. Phys. Lett. 86, Mar. 2005, 86:111114.

Udupa et al., "Voxelized Topology Optimization for Fabrication Compatible Inverse Design of 3D Photonic Devices," Optics Express, Jul. 2019, 27(15):21988-21998.

Yin, "Photonic Inverse Design for 3-D Structures and Optical Phase Change Materials," Massachusetts Institute of Technology, Jun. 2019, 85 pages.

Borel et al., "Topology optimization and fabrication of photonic crystal structures," Optics Express, May 2004, 12(9):6 pages.

Boutanni et al., "Efficient pixel-by-pixel optimization of photonic devices utilizing the Dyson's equation in a Green's function formalism: Part II. Implementation using standard electromagnetic solvers," Journal of the Optical Society of America, Sep. 2019, 36(9)2387-2394.

Molesky et al., "Inverse design in nanophotonics," Nature Photonics, Nov. 2018, 12:659-670.

Piggot, "Automated Design of Puotonic Devices," Dissertation for the degree of Doctor of Philosophy, Stanford University, Department of Electrical Engineering, Jun. 2018, 114 pages.

Xu et al., "Navigating through complex photonic design space using machine learning methods," SPIE Optics + Optoelectronics, Apr. 2019, 11031:110310S-1.

Yu et al., "Inverse-Design-based Light Via for Multi-Layer Photonic Integration Circuit," 2018 Asia Communications and Photonics Conference, 2018, 3 pages.

Damask, "Integrated-Optic Grating-Based Filters For Optical Communications Systems," Thesis for the degree of Doctor of Philosophy, Massachusetts Institute of Technology, May 6, 1996, 282 pages.

Lee et al., "Metasurface eyepiece for augmented reality," Nature Communications, Nov. 2018, 9(1):1-10.

Molesky, "Outlook for inverse design in nanophotonics," CoRR, Jan. 2018, arxiv.org/abs/1801.06715, 13 pages.

News.mit.edu [Online] "New system allows optical deep learning," Jun. 12, 2017, retrieved on Oct. 9, 2018, retrieved from URL <http://news.mit.edu/2017/new-system-allows-optical-deep-learning-0612>, 3 pages.

Piggott et al., "Fabrication-constrained nanophotonic inverse design," Scientific Reports, May 2017, 7(1786):1-7 pages.

Springer.com [Online] "Supplementary Information: Fabrication-constrained nanophotonic inverse design," May 2017, retrieved on Oct. 9, 2018, retrieved from URL <https://static-content.springer.com/esm/art%3A10.1038%2Fs41598-017-01939-2/MediaObjects/41598_2017_1939_MOESM2_ESM.pdf>, 10 pages.

Tahersima et al., "Deep Neural Network Inverse Design of Integrated Nanophotonic Devices," CoRR, Sep. 2018, arxiv.org/abs/1809.03555, 8 pages.

Winick et al., "Design of Grating-Assisted Waveguide Couplers with Weighted Coupling," Journal of Lightwave Technology, Nov. 1991, 9(11):1481-1491.

Andkjaer et al., "Topology-optimized broadband surface relief transmission grating," Proc. SPIE, Physics and Simulation of Optoelectronic Devices, Mar. 7, 2014, 8980:898006-2.

Guo et al. "Study on a Recurrent Convolutional Neural Network Based FDTD Method," 2019 International Applied Computational Electromagnetics Society Symposium—China (ACES), Oct. 31, 2022, 9 pages.

Hughes, "Adjoint-Based Opimization and Inverse Design oh Photonic Devices," Thesis for the degree of Doctor of Philosophy, Stanford University, Department of Applied Physics, Aug. 2019, 158 pages.

Ingersoll, "Multiplexed Volume Bragg Gratings in Narrowand Broadband Spectral Systems: Analysis and Application," Thesis for the degree of Philosophy, University of Minnesota, May 2015, 129 pages.

(56) References Cited

OTHER PUBLICATIONS

Kores et al., "Temperature Dependence of the Spectral Characteristics of Distributed-Feedback Resonators," Optics Express, Feb. 19, 2018, 26(4):4892-905.
Lai et al., "Distributed Bragg Reflector Fiber Laser Fabricated by Frmtosecond Laser Inscription," Optics Letters, Jun. 2006,, 31(11):14 pages.
Li et al. "Enabling High Performance Deep Learning Networks on Embedded Systems," IECON 2017—43rd Annual Conference of the IEEE Industrial Electronics Society, Nov. 1, 2022, 6 pages.
Researchgate.net [online], "Optical Multiplexing and Demultiplexing," Apr. 2003, retrieved on Nov. 9, 2022, retrieved from URL<https://www.researchgate.net/publication/229479977_Optical_Multiplexing_and_Demultiplexing/link/61080e5c0c2bfa282a178420/download/>, 2 pages.
TaherSima et al., "Nanostructured Photonic Power Splitter Design via Convolutional Neural Networks," 2019 Conference on Lasers and Electro-Optics, Oct. 31, 2022, 2 pages.
Tasyurek, "Wavelength Demultiplexing Using Multilayer Structures With Frustrated Total Internal Reflection," Dissertation for the degree of Doctor of Philosophy, Stanford University, Department of Electrical Engineering, Mar. 2015, 205 pages.
Wikipedia.com (Online) "Kernel (image processing))," Dec. 7, 2019, retrieved on Oct. 11, 2022, retrieved from URL«https://en.wikipedia.org/w/index.php?title=Kernel_(image_processing)&oldid=929690058», 6 pages.
Ghanem et al., "Information Fusion: Scaling Subspace-Driven Approaches," arXiv:2204.12035, Apr. 26, 2022, 18 pages.
Trivedi, et al., "Data-driven acceleration of photonic simulations," Scientific Reports, Dec. 23, 2019, 9:19728.

\* cited by examiner

SYSTEMS AND METHODS FOR DESIGNING OPTICAL DEVICES HAVING MODE SELECTIVE FACETS

CROSS REFERENCE TO RELATED APPLICATION

This application is a continuation of U.S. application Ser. No. 16/555,454, filed on Aug. 29, 2019. The disclosure of the prior application is considered part of and is incorporated by reference in the disclosure of this application.

TECHNICAL FIELD

This disclosure generally relates to lasers and optical devices including lasers.

BACKGROUND

Laser diodes are semiconductor devices similar to light-emitting diodes, in which a laser beam is created via stimulated emission of a resonant optical mode created by reflective facets as the ends of a semiconductor block. Laser diodes can be used in a large variety of products, such as barcode readers, laser pointers, disc readers/recorders, laser printers, laser scanners, beam illuminators, LiDARs, and so forth. Laser diodes are typically electrically equivalent to a PIN diode, which refers to a diode with a wide, undoped intrinsic semiconductor region ("I") between a p-type semiconductor region ("P") and an n-type semiconductor region ("N"). The p-type and n-type regions are typically heavily doped because they are used for ohmic contacts. The laser diode's active region, where stimulated photon emission takes place, typically resides within the intrinsic semiconductor region. Often, this region features a more complex structure than simply a single layer of undoped semiconductor material in order to improve photon confinement and hence device efficiency. For example, many laser diodes are double heterostructure lasers.

As with other laser devices, laser diodes are generally composed of a gain region that can include the PIN, within an optical cavity. In many cases, laser diodes include a ridge waveguide formed on a surface of the semiconductor crystal that confines light to a relatively narrow cross-section. Generally, such optical waveguides can support one or more spatial modes. The two ends of the semiconductor crystal can be cleaved to form relatively smooth, parallel facets that serve to recirculate the photons propagating in the waveguide mode. Photons emitted into a mode of the waveguide can travel along the waveguide and be reflected several times from each end of the laser diode before they exit the diode. As photons propagate in the optical cavity formed by the two facets, the associated light field is amplified by stimulated emission in the laser's active region.

SUMMARY

Systems and methods for designing optical devices, such as laser diodes, having mode-selective facets are disclosed. In a laser diode featuring a ridge waveguide, for example, such facets can preferentially provide reflection for desired waveguide mode(s) in such a manner that other modes are prevented from lasing. The methods can provide laser diodes with improved beam quality output, including laser diodes having relatively large cross-sectional areas that can support multiple spatial modes.

The design methods can include using a computational inverse design tool to design the laser facets such that they have high reflectivity for light propagating in at least one first desired spatial mode of the waveguide, while having relatively low reflectivity for light propagating in other spatial modes. The methods include choosing a loss function that rewards reflectivity in the desired modes while penalizing reflectivity in all other modes, and defining an initial structure for the laser diode, including an initial structure for the facets. Then, using a time domain finite difference method for solving Maxwell's equations, for example, the tool can find solutions (i.e., facet structures) that give a high amount of reflectance for the desired light mode while minimizing reflectance for all other light modes by optimizing the loss function. Alternatively, or additionally, the loss function can correspond to a desired output beam profile. In such instances, the loss function can account for the far-field pattern for each light mode, and the tool can find solutions that gives a desirable output beam.

The solutions can be found by breaking down a simulation space into an array of voxels subwavelength in size, and for each voxel corresponding to the structure of the device, optimizing one or more parameters corresponding to the structural properties of the device. Generally, each portion of the optical device (e.g., layers, substrates, metal contact, reflective surfaces, etc.) is made up of multiple voxels at which parameter values corresponding to the composition of the device at that voxel are defined. The one or more parameters can include a refractive index or a permittivity, for example. In some embodiments, optimal refractive indices and a shape of each portion of the device can be determined based on how much the permittivity should change for each voxel to minimize a loss function associated with one or more spatial modes according to performance characteristics such as reflectance percentages of all modes. An entire structure of the optical device can be established based on optimal refractive indices for each portion of the device.

The loss function can also account for other considerations, including manufacturing penalties, where the tool accounts for the feasibility of the optimized design. For example, it might not be feasible to manufacture alternative voxels associated with a waveguide using different materials, and thus a penalty condition specifying an amount of voxels that should have the same materials can be used. The loss function can also take into account manufacturing cost and/or materials available.

In at least one aspect of the present disclosure, a system for designing a mode selective optical device comprising one or more optical interfaces defining an optical cavity is provided. The system includes one or more processors. The system includes computer storage storing executable computer instructions in which, when executed by the one or more processers, cause the one or more processors to perform one or more operations. The operations include defining a loss function within a simulation space encompassing the optical device, the loss function corresponding to an electromagnetic field having an operative wavelength within the optical device resulting from an interaction between an input electromagnetic field at the operative wavelength and the one or more optical interfaces of the optical device in which, at least one of the optical interfaces preferentially supports a subset of possible optical modes in the optical cavity at the operative wavelength. The operations includes defining an initial structure for each of the one or more optical interfaces, each initial structure being defined using a plurality of voxels, at least some of the voxels having a dimension smaller than an operative wavelength of the optical device. The operations includes determining values for at least one structural parameter and/or at least one functional parameter of the one or more optical interfaces by solving Maxwell's equations so that a loss determined according to the loss function is within a target loss threshold, in which the at least one parameter corresponds to a structure of the optical device. The operations includes defining a final structure of the one or more optical interfaces based on the values for the one or more structural and/or functional parameters.

The optical device can be a laser diode. The one or more optical interfaces can include at least one of: a reflective surface, a substrate, a portion of a waveguide, or a layer surface.

Preferentially supporting a subset of possible optical modes can include at least one of: preferentially reflecting a subset of possible optical modes, preferentially transmitting a subset of possible optical modes, or preferentially scattering a subset of possible optical modes. The subset of possible modes can include a fundamental mode and at least one higher-order mode.

At least some of the voxels can have a dimension of 0.1 times the operative wavelength. Determining values for at least one structural parameter can include determining a refractive index at each voxel. Determining values for at least one functional parameter can include determining a modal reflectance percentage.

Solving Maxwell's equations can include using a finite-difference time domain solver. Defining a final structure of the one or more optical interfaces can include defining a material composition at each optical interface.

These and other aspects, features, and implementations can be expressed as methods, apparatus, systems, computer storage storing executable computer instructions, components, program products, methods of doing business, means or steps for performing a function, and in other ways, and will become apparent from the following descriptions, including the claims.

DETAILED DESCRIPTION

Figure 1A:
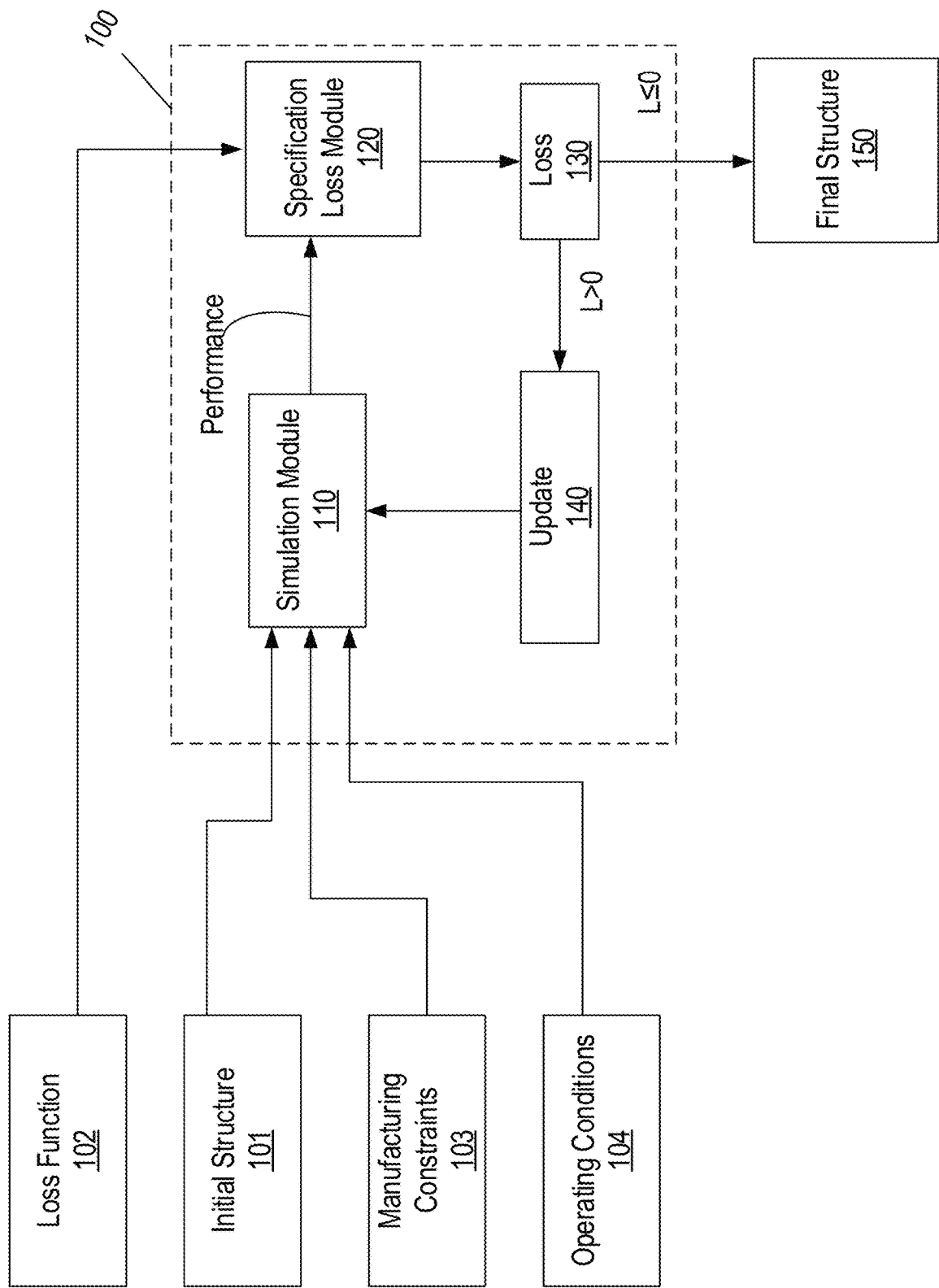
FIG. 1A shows an architecture for a computational inverse design tool that uses a simulation module and a specification loss module to iteratively simulate the performance of an optical device and determine a loss for the device.
Figure 1B:
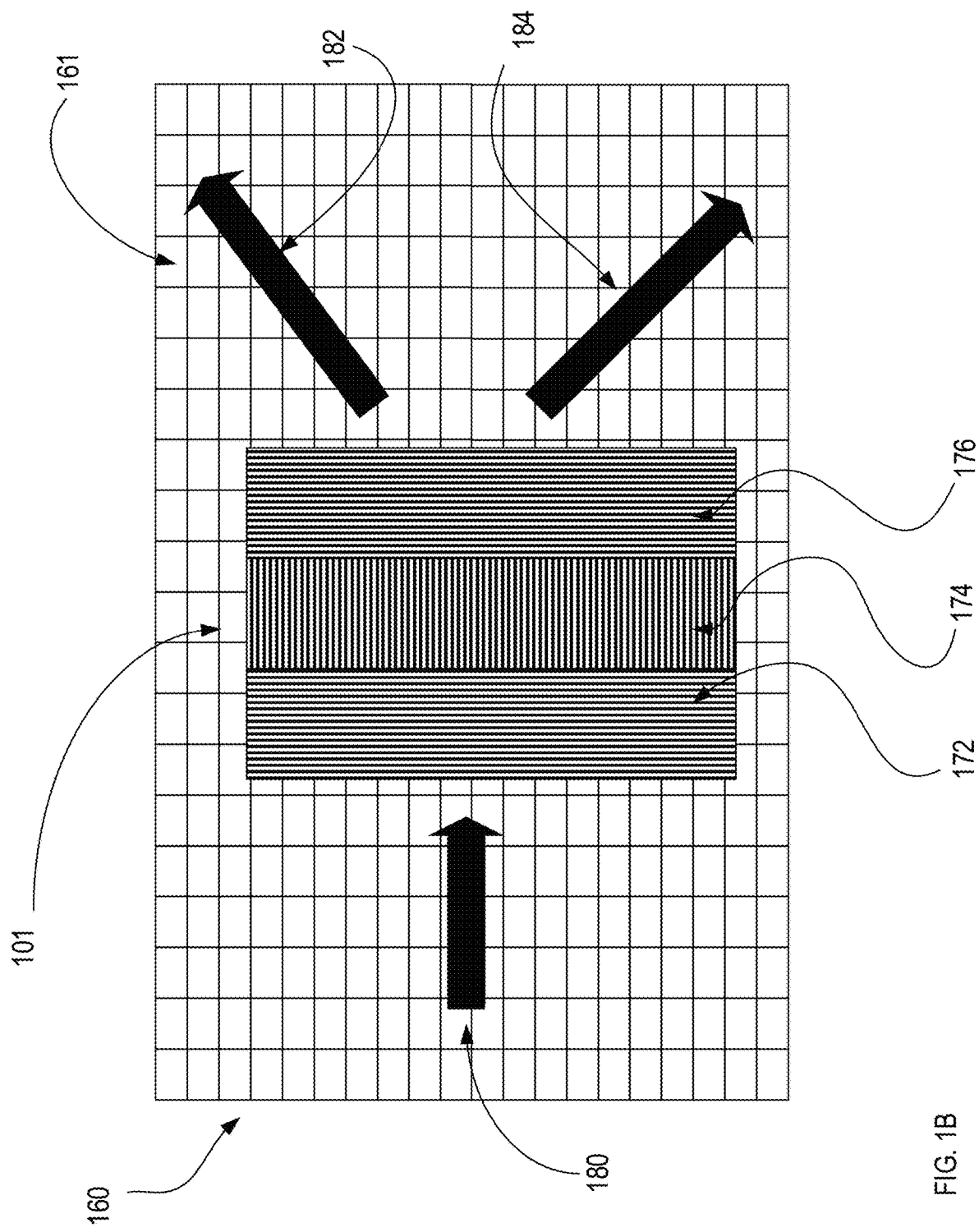
FIG. 1B shows an initial structure for a beam splitter as defined within a simulation space.

Referring to FIGS. 1A-1B, the structure of an optical device having mode selective facets is determined using a design tool 100, which refers to a computational engine that determines a design for the optical device that satisfies pre-specified performance criteria. Such an approach to design is referred to as "inverse design" and the computational engine for solving such problems is referred to as an "inverse design tool."

In certain implementations, the inverse design problem involves having a designer specify the performance criteria for the optical device in terms of a "loss function," L (also sometimes referred to a "cost function"), which represents a variation of the performance of a given design for the optical device from the specified performance. When L is below a specified threshold, e.g., $L \leq 0$, for a given design, it signifies that the specified performance has been met. By appropriately defining the loss, the inverse problem can therefore be expressed as finding a design, z, for the optical device which satisfies $L \leq 0$.

Inverse design problems can be solved computationally through a combination of a simulation module and a loss module. The simulation module is used to mathematically model a physical system incorporating a given design for the optical device using equations that describe the physical properties of the physical system, such as Maxwell's equations. The simulation module can also mathematically account for constraints involved in manufacturing (e.g., structure sizes, structure shapes, and material properties) and operating the device (e.g., thermal effects). The loss module determines the loss for a particular design, effectively evaluating the performance of the device compared to the desired performance.

FIG. 1A shows an architecture for a computational inverse design tool 100 that uses a simulation module 110 and a loss module 120 to iteratively simulate the performance of an optical device and determine a loss 130 for the device. Depending on whether the loss exceeds (e.g., $L>0$) or meets (e.g., $L \leq 0$) a specified threshold value, the design tool can either update (140) a structure of the device or produces a final structure 150 for the device.

The design tool 100 uses a number of input parameters from a user in order to determine a final structure for the device. These include an initial structure 101 for the optical device, a loss function 102, manufacturing constraints 103 and operating conditions 104. Initial structure 101 generally includes a starting point for the composition and dimensions for the optical device. Loss function 102 is based on the desired performance of the optical device and is typically defined by a desired electric field profile. In many cases, the desired electric field profile corresponds to an electric field output by the optical device in response to a particular input or inputs. Manufacturing constraints 103 incorporate constraints based on practical manufacturing considerations. For example, manufacturing constraints can be associated with an amount of spacing between components, size of one or more components (e.g., size in one dimension, e.g., width, and/or overall size, e.g., volume), radius of curvature of one or more components, maximum cost of potential materials, availability of potential materials, and so forth. Operating conditions 104 account for other physical properties of the system, such as sources or sinks of electromagnetic fields, operating temperature, etc.

Before discussing the application of the inverse design tool to optical devices having mode selective facets, it is instructive to consider the example of a simple beam splitter. FIG. 1B shows an initial structure for a beam splitter as defined within a simulation space. Referring also to FIG. 1B, generally, initial structure 101 of the optical device is defined within a simulation space 160 composed of voxels 161. Voxels are three-dimensional volume elements at which physical properties (e.g., refractive index, field values, and temperature) can be defined and/or calculated. Each voxel 161 can be sub-wavelength (e.g., 0.5λ or less, 0.2λ or less, 0.1λ or less, or 0.05λ or less) for a particular wavelength of interest in at least one dimension. In many cases, voxels are sub-wavelength in three dimensions.

As illustrated, initial structure 101 is composed of three regions 172, 174, and 176 each composed of a different material. Each extends across multiple voxels. Arrow 180 represents an input electromagnetic field incident on one side of initial structure 101. This field is a component of operating conditions 104, input into the simulation module 110. Arrows 182 and 184 represent the desired performance (e.g., the desired electric field profile output by the optical device in response to the input electromagnetic field) of the optical device and the loss can be established as a difference, on a voxel by voxel basis, between the electromagnetic field represented by these arrows and the electromagnetic field that results from the interaction between the input electromagnetic field and initial structure 101.

Referring again to FIG. 1A, simulation module 110 determines the performance of the optical device using a differentiable solver for Maxwell's equations to model electromagnetic fields resulting from the one or more sources interacting with the structure defined for the optical device. In one form, Maxwell's equations can be expressed as:

$$\frac{\partial H}{\partial t} = -\frac{1}{\mu}(\nabla \times E - M_{source}); \text{ and}$$

$$\frac{\partial E}{\partial t} = \frac{1}{\epsilon}(\nabla \times H - J_{source}),$$

where E and H represent electric and magnetic fields, ε and μ represent permittivity and permeability of the material at each voxel, and $J_{source}$ and $M_{source}$ are electric and magnetic currents. Numerical solution of Maxwell's equations yields electric and magnetic field values at each voxel, from which design tool 100 can calculate loss 130 for each voxel using loss module 120.

In some embodiments, a finite difference time domain (FDTD) approach is used to solve Maxwell's equations. Details of such an approach can be found, for example, in *Computational Electrodynamics: the Finite-Difference Time-Domain Method*, Third Edition, by A. Taflove and S. C. Hagness (Artech House, 2005). Such an approach involves updating values of the electric and magnetic fields at each voxel through a series of incremental time steps. Mathematically, this update operation can be expressed by a function □, where $$x_{i+1} = \Box(x_i, b_i, z)$$

for i=1, ..., n. Here, n is the total number of time steps for the simulation, $x_i$ refers to the electric and magnetic fields at time step i, $b_i$ represents electric and magnetic sources at time step i, and z is a structural variable, corresponding to the topology of the optical device. Additionally, the loss operation can be expressed as L=f($x_1$, ..., $x_n$) and takes as input all the computed fields and produces a single, real-valued scalar that can be minimized.

In such implementations, inverse design tool 100 can optimize a structure for the optical device (i.e., final structure 150 in FIG. 1A) based on a structural gradient, $$\frac{\partial L}{\partial z}$$

according to the formalism above. This structural gradient can be determined according to the relationship:

$$\frac{dL}{dz} = \sum_i \frac{\partial L}{\partial x_i} \frac{\partial x_i}{\partial z}.$$

The above calculations can be performed using a convolutional neural network formalism in which the matrices representing the FDTD set of equations are sparsely populated such that the calculations can be efficiently performed using one or more tensor processing units.

The loss function, L, for an optical device can be established in a variety of ways but generally involves defining a desired electric field distribution (or corresponding measure of electric field strength, such as intensity) at multiple wavelengths (or, correspondingly, frequencies) and comparing a simulated electric field distribution to the desired distribution at each of those wavelengths. The comparison can involve simply determining a difference at each voxel for which the desired distribution is defined or a difference of squares.

The loss function is generally defined as at least a plurality of operational wavelengths of the component. For example, in applications where the device is expected to operate at a number of discrete wavelengths of interest, the loss function can incorporate the performance of the device at each of these wavelengths. The number of wavelengths can vary as necessary. For example, some applications can include a large number of wavelengths (e.g., 20 or more wavelengths, 50 or more wavelengths, or 100 or more wavelengths) spanning a range of operational wavelengths. Alternatively, the loss function can be defined for a representative subset of the operational wavelengths. For instance, where the operational wavelengths span a range of wavelengths, the loss function can be evaluated for a finite number of discrete wavelengths spanning (e.g., evenly spanning) the operational range.

Figure 2A:
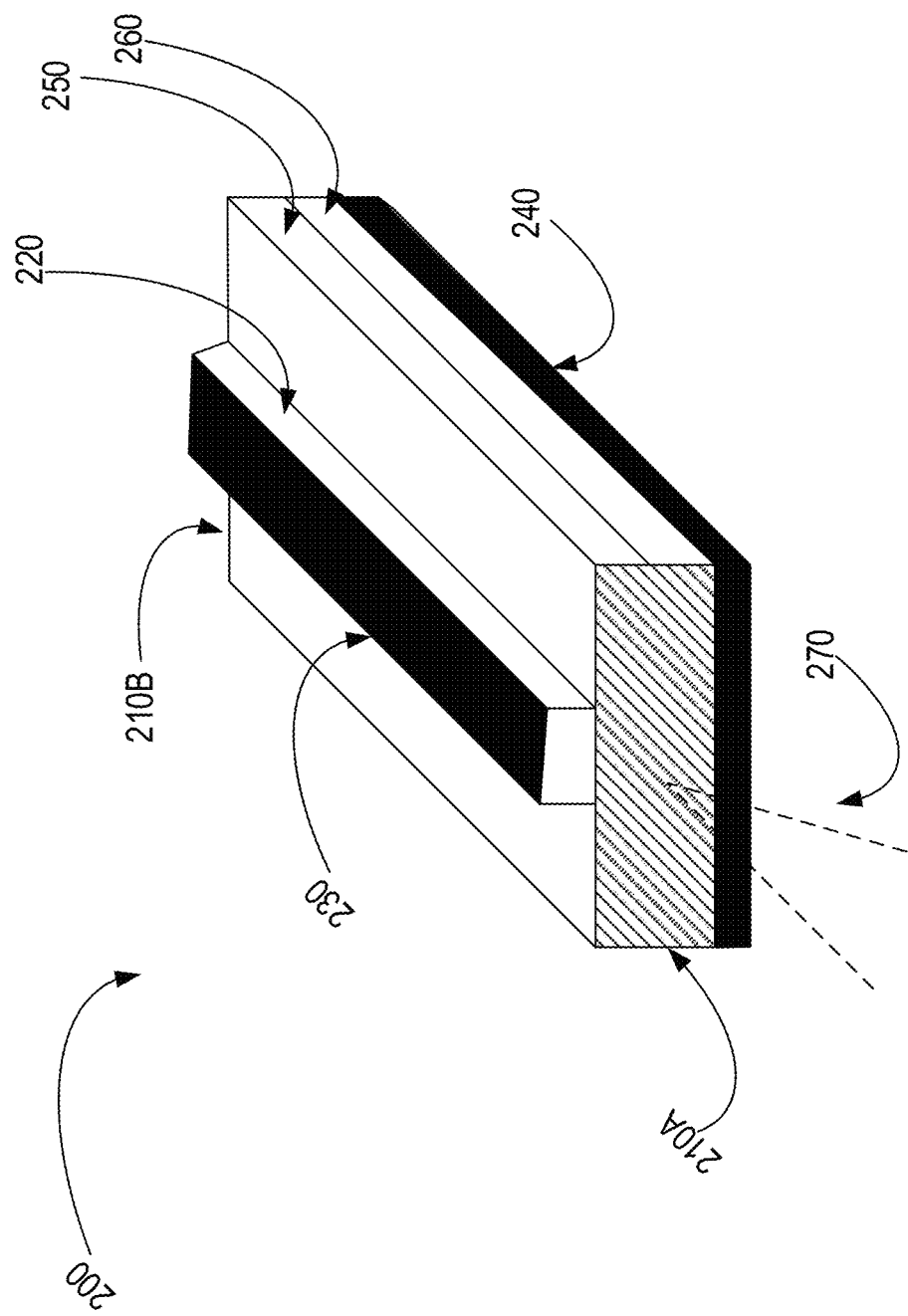
FIG. 2A shows an example of initial structure of a laser diode.

Turning now to the example of a laser diode with mode-selective facets, an initial structure of a laser diode 200 is shown in FIG. 2A. The laser diode 200 includes a first facet 210A, a second facet 210B, a ridge waveguide 220, a first contact electrode 230, a second contact electrode 240, and a PN junction 250. These components are anchored onto a substrate 260.

The contact electrodes 230,240 include electrical conductors. They cooperate together to form non-rectifying electrical junctions. They further cooperate together to allow charge to flow in both directions between them. Examples of materials that can be used to make the contact electrodes 230, 240 include Silicon, Germanium, Gallium Arsenide, Gallium Nitride, Indium Antinomide, Zinc Oxide, and so forth.

The PN junction 250 is the area between a p-cladded region and n-cladded region of the laser diode 200 (e.g., the undoped intrinsic semiconductor region previously discussed) and is configured to receive holes and electrons from these surrounding regions (as discussed later with reference to FIG. 2B). When the holes and electrons interact with each other within the PN junction 250, they produce spontaneous emission. For example, electrons may re-occupy the energy state of the hole, emitting a photon with energy equal to the difference between the electron's original state and the hole's state. The PN junction 250 includes an active region (as discussed later with reference to FIG. 2B). In some embodiments, the active region of the PN junction 250 includes quantum well structures, which refers to thin layers that confine the charge carriers (e.g., holes and electrons) in one dimension. In some embodiments, the active region of the PN junction 250 includes quantum dots, which are microscopic structures that confine charge carriers in three-dimensions.

The ridged waveguide 220 receives the light emitted within the PN junction 250 and allows the light to traverse the waveguide 220 within the laser diode 200. The ridged waveguide 220 includes a p-cladded ridge and a waveguide region. These components are discussed later with reference to FIG. 2B. The ridged waveguide 220 can include materials such as certain crystals and glasses. In some embodiments, the ridged waveguide 220 is cleaved at its ends to form part of the facets 210A,210B. As shown, the facets 210A,210B are at opposite ends of the laser diode 200 from each other. The facets 210A,210B include substantially flat surfaces that can reflect at least some of the light as it traverses the ridged waveguide 220. In some embodiments, the second facet 210B is fully reflective while the first facet 210A is partially reflective. One or both of the facets 210A,210B can include dielectric mirrors. As the light travels through the ridged waveguide 220, it is reflected by the facets 210A,210B which allows the light to be amplified through stimulated emission. In some implementations, once the amount of amplification surpasses the amount of loss, an optical output 270 (e.g., laser beam) exits the laser diode 200 through the first facet 210A.

The ridged waveguide 220 is surrounded by the substrate 260. The substrate 260 is sometimes referred to as the active region 260. In some embodiments, the substrate 260 is thin enough to act as a quantum well, which refers to thin layers that confine charge carriers in one dimension. In some embodiments, the substrate 260 include quantum dots, which are microscopic structures that confine charge carriers in three-dimensions. Therefore, the substrate 260 can facilitate the confinement of light to the ridged waveguide 220.

In some embodiments, the substrate 260 includes semiconducting material. For example, the substrate 260 can include Indium Phosphide, Silicon Carbide, Gallium Nitride, and so forth. In some embodiments, the substrate 260 can include an n-cladding region, which is discussed later with reference to FIG. 2B.

Figure 2B:
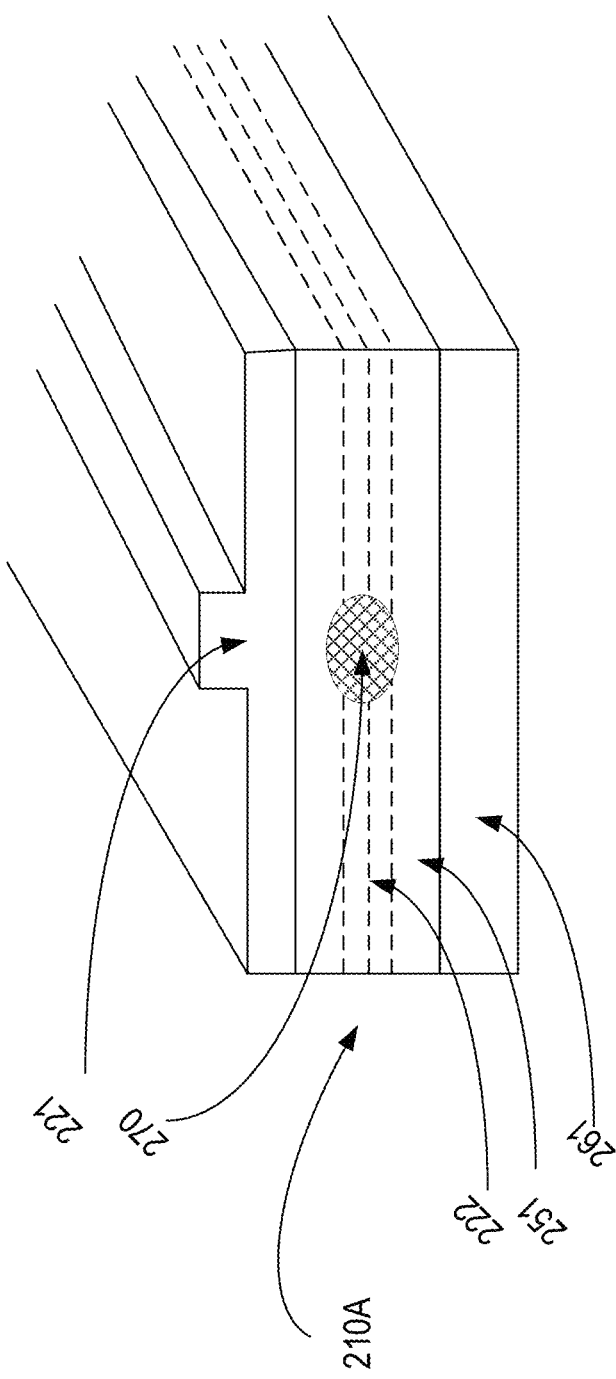
FIG. 2B shows a close-up illustration of a first facet of the laser diode.

FIG. 2B shows a close-up illustration of the first facet 210A of the laser diode 200. The first facet 210A includes a p-cladded ridge 221, a waveguide region 222, an active region 251, and a n-cladded region 261.

In some implementations, the p-cladded ridge 221 includes at least one acceptor, which refers to a dopant atom that, when added to a semiconductor, forms a p-type (positive) region (e.g., an electron accepting region). Materials used to form the p-cladded ridge can include Boron, Aluminum, Gallium, Indium and so forth. The n-cladded region 261 can include at least one donor, which refers to a dopant atom, that, when added to a semiconductor, forms an n-type region (e.g., an electron donating region). Materials used to form the n-cladded region 261 can include Phosphorous, Arsenic, Antimony, Bismuth, Lithium, and so forth. When a voltage is applied to the device, the p-cladded region (e.g., p-cladded ridge 221) and the n-cladded region 261 cooperate together to generate light emission through pumping carriers (e.g., electrons and holes) into the active region 251 of the PN junction 250, which is the area between the p-cladded ridge 221 and the n-cladded region 261. The characteristics of the light generated can depend on the material composition of the p-cladded ridge 221 and the n-cladded region 261.

The active region 251 is surrounded by the waveguide region 222. The active region 251 acts as a source of optical gain, which results from the stimulated emission of electronic (or molecular) transitions to a lower energy state from a higher energy state as the carriers (e.g., holes and electrons) are pumped into the active region 251 from the p-cladded ridge 221 (or p-cladded region 221) and n-cladded region 261. The emitted light is introduced into the waveguide region 222. The active region 251 can include materials such as certain crystals, glasses, gases, and semiconductors. In some embodiments, the active region 251 includes crystals doped with rare-earth ions such as Ytterbium, Erbium, and Neodymium. Crystals can also be doped with yttrium aluminum garnet, yttrium orthovanadate, and/or sapphire. Examples of semiconductors can include gallium arsenide, indium gallium arsenide, and/or gallium nitride. In some embodiments, the active region 251 includes quantum wells. In some embodiments, the active region 251 and the waveguide region 222 have a higher refractive index than the p-cladded region 221 and the n-cladded region 261. This allows for confining the emitted light to the waveguide region 222. The ends of the active region 251 can be cleaved such that they form fully and/or partial reflective surfaces (e.g., one end can be fully reflective while the opposite end can be partially reflective). The ends of the active region 251 can include dielectric mirrors. As the light travels through the waveguide region 222, it is reflected by the ends of the active region 251, which allows the light to be amplified through stimulated emission. In some implementations, once the amount of amplification surpasses the amount of loss, the optical output 270 (e.g., laser beam) exits the laser diode 200 through the first facet 210A. In some embodiments, if the waveguide region 222 is wide relative to the wavelength of light (e.g., has a high cross-sectional area), then multiple transverse optical modes can traverse through the waveguide region 222.

Figure 3:
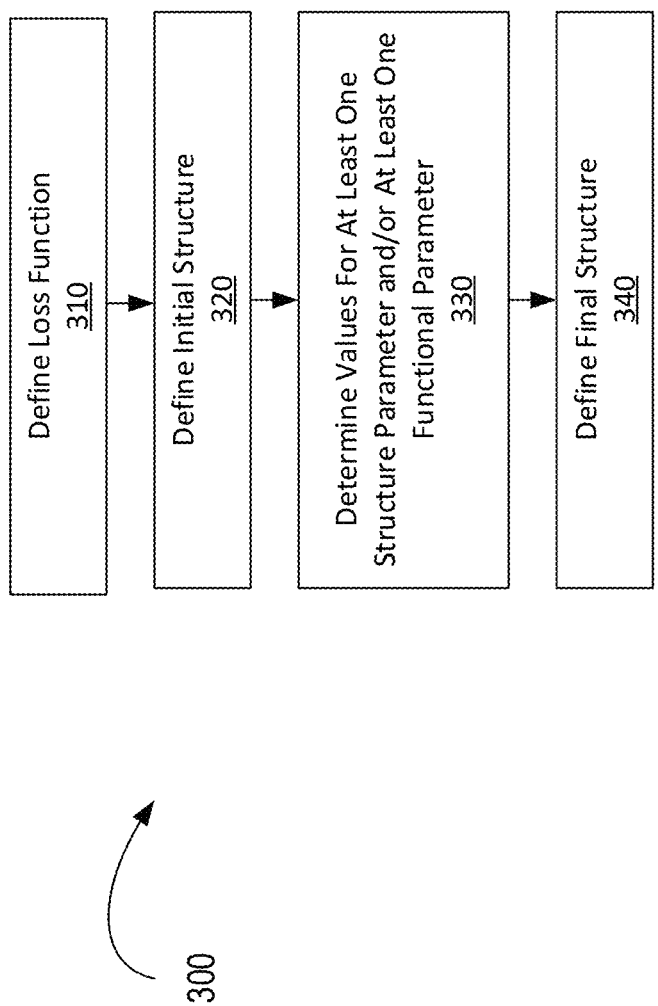
FIG. 3 depicts a flowchart showing a method for designing an optical device to have mode-selective laser facets, according to one or more embodiments of the present disclosure.

FIG. 3 depicts a flowchart showing a method 300 for designing an optical device to have mode-selective laser facets, according to one or more embodiments of the present disclosure. The optical device can be similar to the laser diode 200 in that it can include one or more optical interfaces (e.g., surfaces of layers, substrates, waveguide portions, etc.) defining an optical cavity. The method includes applying an optimization routine to design the optical device. In some embodiments, the optimization routine may include defining a loss function (block 310), defining an initial structure (block 320), determining values for at least one structure parameter and/or at least one functional parameter (block 330), and defining a final structure (block 340). In some embodiments, instead of defining an initial structure, the optimization routine itself may generate the initial structure.

At block 310, a loss function is defined within a simulation space encompassing the optical device. In some implementations, the loss function corresponds to an electromagnetic field having an operative wavelength within the optical device resulting from an interaction between an input electromagnetic field at the operative wavelength and the one or more optical interfaces of the optical device. The input electromagnetic field can be the initial light emission resulting from the current generated at the PN junction of a laser diode, as described above with reference to FIG. 2A.

In some implementations, the loss function is based on a target electric field. For example, the loss function can be based on a target electric field incident at one or both of the facets of a laser diode as discussed previously with reference to FIG. 2A. Additionally, or alternatively, the loss function can be based on a target electric field that is emitted from the optical device. In some implementations, the target electric field is defined, at least partially, by a modal structure. For example, the target electric field can be defined as only including one mode, such as a fundamental mode. In some implementations, the target electric field is defined, at least partially, by an intensity profile corresponding to one or more modes of light. For example, the target electric field can include a mode (such as a fundamental mode) having a more simple Gaussian intensity profiles when compared with other modes (such as higher order modes) that are also included within the target electric field.

Referring back to FIG. 3, in some implementations, the loss function is associated with, for example, a signal-to-noise ratio and/or a power waveform of an output electromagnetic signal. The loss function can be associated with a desired light mode. For example, the loss function can be associated with a fundamental light mode (e.g., the Gaussian mode). The loss function can be associated with a reflectance percentage associated with one or more light modes. As described previously, if the waveguide region of the optical device has a cross-sectional area larger than the operative wavelength, the resulting light that is traversing the waveguide can include multiple modes. In some implementations, the loss function is associated with a reflectance percentage for one mode of light (e.g., the fundamental mode), and a reflectance percentage for other modes of light. Therefore, in some implementations, the loss function is configured to reward reflectivity in one or more desired modes, and penalize reflectivity in the other undesired modes. Additionally, or alternatively, the loss function can account for more far-field patterns of one or more modes. In such instances, the loss function can be configured to reward outputs corresponding to desirable far-field patterns while penalizing outputs corresponding to undesirable far-field patterns.

In some implementations, the loss function can account for manufacturing cost, feasibility, and/or materials available. For example, it may not be feasible to design some of the optical interfaces of the optical device with more than one material. It may not be feasible for the optical interfaces to include curvatures less than a certain size. Due to budget considerations, it may not be feasible to make the optical interfaces out of extraordinarily expensive materials. The loss function can account for these considerations and treat them as penalties.

At block 320, an initial structure for each of the one or more optical interfaces is defined. The initial structures can be defined to include a n-cladded region, a p-cladded region, an active region, a waveguide region, reflective surfaces, and so forth. For example, the initial structure can be the laser diode 200 discussed earlier with reference to FIG. 2A. In some implementations, each initial structure can be separated into a plurality of voxels. In some implementations, the computational inverse design tool 200 of FIG. 2A separates the structures into voxels. In some implementations, at least some of the voxels have a dimension smaller than an operative wavelength of the optical device (e.g., $0.5\lambda$ or less, $0.2\lambda$ or less, $0.1\lambda$ or less, $0.05\lambda$ or less). The dimensions of the voxels can be selected based on, for example, manufacturing tolerances, minimum feature size that a given process can allow, or both.

In some implementations, at least one of the optical interfaces is defined to preferentially support a subset of possible optical modes in the optical cavity at the operative wavelength. In some implementations, the subset of possible optical modes includes only one optical mode. For example, the one or more optical interfaces can be defined such that they only reflect light in one optical mode, while absorbing or scattering light in other possible optical modes. The one or more optical interfaces can be configured such that they only transmit and/or scatter light in one optical mode while not transmitting and/or scatter light in other optical modes.

At block 330, values are determined for at least one structural parameter and/or at least one functional parameter of the one or more optical interfaces of the optical device. For example, values can be determined for a refractive index at each voxel of an optical interface (i.e., structural parameter). Determined values can be associated with a thickness, composition, and/or shape of a reflective surface. In some implementations, the determined values are associated with the thickness, composition, and/or shape of one or more facets of the initial structure and/or the waveguide region of the initial structure. As another example, a modal reflectance percentage (i.e., functional parameter) can be determined for the one or more optical interfaces, such as the facets of the initial structure. The modal reflectance percentages can correspond to one or more modes of light. For example, the determined functional parameter values can include higher reflectance percentages (e.g., 95%, 98%, etc.) for fundamental light modes and lower reflectance percentages (e.g., 20%, 18%, etc.) for higher order light modes. In some implementations, the values that can be determined correspond to any quantity that represents some electromagnetic field distribution, such as the ratio of outgoing to incoming waves of a particular mode profile (that is, the loss function can be defined in terms of these parameters as a function of frequency and spatial mode). The values are determined by solving Maxwell's equations to optimize the loss function in accordance with the initially defined structure. For example, the values can be determined such that a loss (e.g., as defined in terms of signal-to-noise ratio and/or intensity), in accordance with the defined loss function, is within a target loss threshold. Thus, values of the structural and functional parameters of the optical interfaces of the optical device can be determined in such a manner that loss is minimized (or maximized). In some implementations, the Maxwell's equations are solved using a finite-difference time domain solver. In some implementations, the finite-difference time domain solver includes the computational inverse design tool 100 described earlier with reference to FIG. 1A.

At block 340, a final structure for the one or more optical interfaces is defined based on the determined values of the structural and/or functional parameters. For example, based on the determined values, the material composition at each optical interface can be determined. As another example, the amount of thickness of a coating applied to one or more reflective surfaces of the optical device (e.g., at the facets of the laser diode) can be determined based on the determined values. Examples of final structures that can be determined also include the type of material to use for a waveguide region, the composition of p-cladded and n-cladded regions, the thickness of an active region, the amount of quantum dots in an active region, and so forth. The amount and size of hole arrays to be incorporated into one or more optical interfaces can also be determined based on the determined values. In some implementations, the final structures of the optical interfaces are designed such that the optical device minimizes loss for light traversing in one mode (e.g., the fundamental mode) while maximizing loss for light traversing in other light modes.

In some aspects, implementations described in the present disclosure may rely on machine learning engines and machine learning algorithms to perform generative design tasks. Generative design may, in some aspects, mimic an evolutionary problem-solving process, which uses inputs such as design goals, computes hundreds (if not thousands or millions) of potential solutions, and selects one or more best solutions from the multitude of solution permutations. Indeed, in some aspects, machine learning engines applied to a generative design process may generate or process thousands, or even millions, of design choices or test configurations and learn from each iterative solution. Thus, aspects of the described implementations may use the machine learning engines in a generative design process to generate unique and bespoke solutions beyond those that a human being, alone, could create, to arrive at the best design solution. In some aspects, the machine learning engines and algorithms of the generative design process may rely on algorithmic and parametric modeling within a process that includes a design schema, one or more machine learning engines configured to create variations, and one or more machine learning engines configured to select desirable outcomes.

Figure 4:
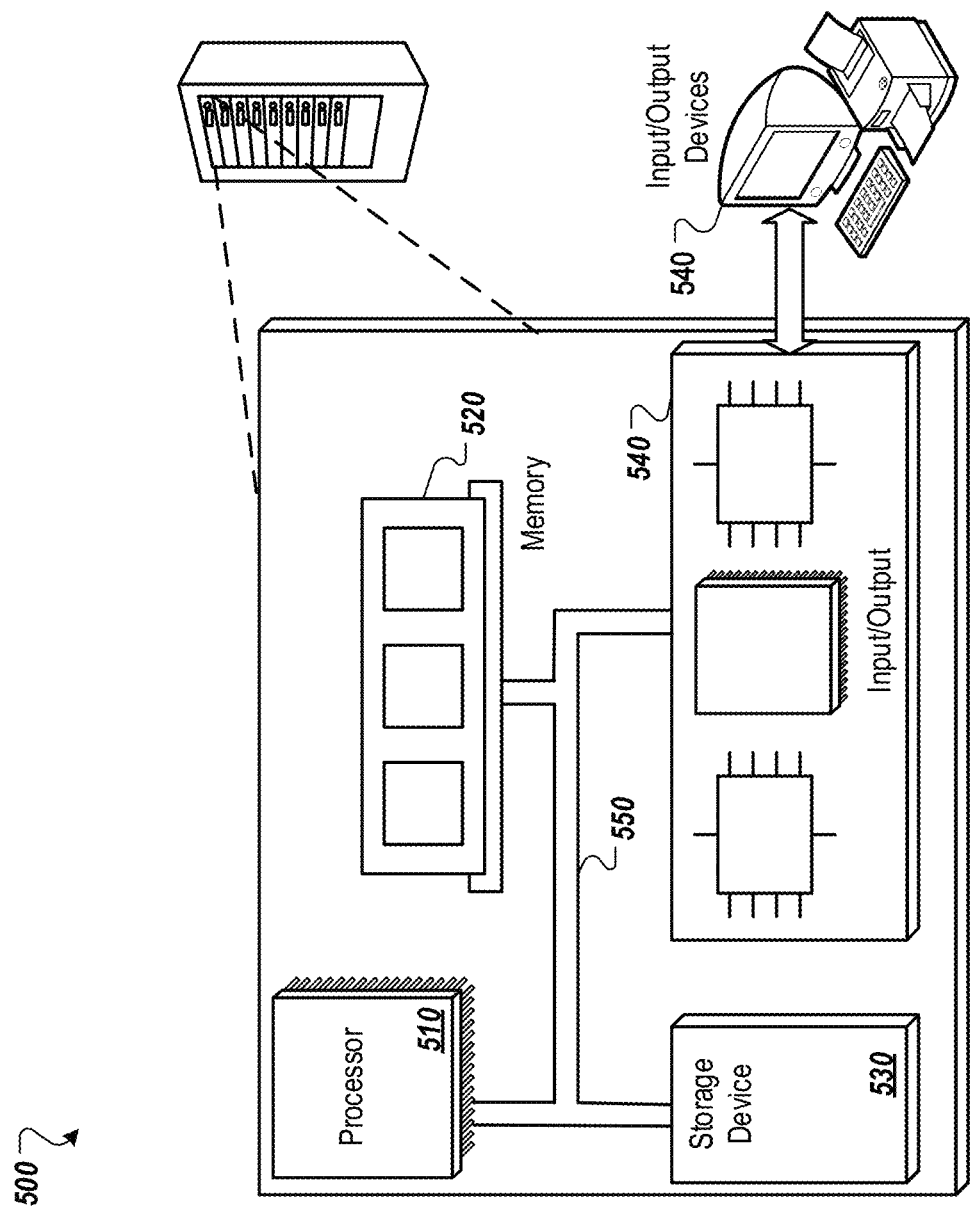
FIG. 4 is a schematic diagram of an example computer system, according to one or more embodiments of the present disclosure.

FIG. 4 is a schematic diagram of an example computer system 500. The system 500 can be used to carry out the operations described in association with any of the computer-implemented methods described previously, according to some implementations. In some implementations, computing systems and devices and the functional operations described in this specification can be implemented in digital electronic circuitry, in tangibly-embodied computer software or firmware, in computer hardware, including the structures disclosed in this specification (e.g., machine learning engine(s)) and their structural equivalents, or in combinations of one or more of them. The system 500 is intended to include various forms of digital computers, such as laptops, desktops, workstations, personal digital assistants, servers, blade servers, mainframes, and other appropriate computers, including vehicles installed on base units or pod units of modular vehicles. The system 500 can also include mobile devices, such as personal digital assistants, cellular telephones, smartphones, and other similar computing devices. Additionally the system can include portable storage media, such as, Universal Serial Bus (USB) flash drives. For example, the USB flash drives may store operating systems and other applications. The USB flash drives can include input/output components, such as a wireless transmitter or USB connector that may be inserted into a USB port of another computing device.

The system 500 includes a processor 510, a memory 520, a storage device 530, and an input/output device 560. Each of the components 510, 520, 530, and 560 are interconnected using a system bus 550. The processor 510 is capable of processing instructions for execution within the system 500. The processor may be designed using any of a number of architectures. For example, the processor 510 may be a CISC (Complex Instruction Set Computers) processor, a RISC (Reduced Instruction Set Computer) processor, or a MISC (Minimal Instruction Set Computer) processor.

In one implementation, the processor 510 is a single-threaded processor. In another implementation, the processor 510 is a multi-threaded processor. The processor 510 is capable of processing instructions stored in the memory 520 or on the storage device 530 to display graphical information for a user interface on the input/output device 560.

The memory 520 stores information within the system 500. In one implementation, the memory 520 is a computer-readable medium. In one implementation, the memory 520 is a volatile memory unit. In another implementation, the memory 520 is a non-volatile memory unit.

The storage device 530 is capable of providing mass storage for the system 500. In one implementation, the storage device 530 is a computer-readable medium. In various different implementations, the storage device 530 may be a floppy disk device, a hard disk device, an optical disk device, or a tape device.

The input/output device 560 provides input/output operations for the system 500. In one implementation, the input/output device 560 includes a keyboard and/or pointing device. In another implementation, the input/output device 560 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, e.g., in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory, a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer. Additionally, such activities can be implemented via touch-screen flat-panel displays and other appropriate mechanisms.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include a local area network (LAN), a wide area network ("WAN), peer-to-peer networks (having ad-hoc or static members), grid computing infrastructures, and the Internet.

The computer system can include clients and servers. A client and server are generally remote from each other and typically interact through a network, such as the described one. The relationship of client and server arises by virtue of computer programs running on the respective computers and having a client-server relationship to each other.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results.

What is claimed is:

1. A method of making an optical device comprising an optical cavity, the method comprising:
defining an initial structure for each of one or more optical interfaces of the optical device, each initial structure being defined using a plurality of voxels in a computational model, at least some of the voxels having a dimension smaller than an operative wavelength of the optical device, the initial structure of a first of the optical interfaces supporting a plurality of optical modes in the optical cavity at the operative wavelength;
defining a loss function within a computational simulation space encompassing the optical device, the loss function corresponding to an electromagnetic field having the operative wavelength resulting from an interaction between an input electromagnetic field at the operative wavelength and the one or more optical interfaces of the optical device;
determining values for one or more structural parameters corresponding to a structure of the one or more optical interfaces by solving Maxwell's equations so that a loss determined according to the loss function is within a target loss threshold;
defining a final structure of the one or more optical interfaces based on the values for the one or more structural parameters, the optical cavity according to the final structure preferentially supporting a subset of the plurality of the optical modes at the operative wavelength; and
making the optical device according to the final structure.

2. The method of claim 1, wherein the determined values for the one or more structural parameters have a dimension smaller than the operative wavelength.

3. The method of claim 1, wherein the one or more structural parameters comprise a refractive index of the optical device at the one or more optical interfaces.

4. The method of claim 1, wherein the one or more optical interfaces preferentially reflect incident light at the operative wavelength in the subset of the plurality of the optical modes compared to incident light at the operative wavelength not in the subset of the plurality of the optical modes.

5. The method of claim 1, wherein the one or more optical interfaces preferentially transmit incident light at the operative wavelength in the subset of the plurality of the optical modes compared to incident light at the operative wavelength not in the subset of the plurality of the optical modes.

6. The method of claim 1, wherein the one or more optical interfaces preferentially scatter incident light at the operative wavelength in the subset of the plurality of the optical modes compared to incident light at the operative wavelength not in the subset of the plurality of the optical modes.

7. The method of claim 1, wherein the subset of the plurality of optical modes comprises a fundamental mode.

8. The method of claim 7, wherein the subset of the plurality of optical modes comprises at least one mode higher-order mode.

9. The method of claim 1, wherein the dimension of the determined values for the one or more structural parameters correspond to a minimum feature size allowable by a process used to fabricate the one or more optical interfaces.

10. The method of claim 1, wherein the optical device is a laser diode.

11. The method of claim 10, wherein the optical device comprises a waveguide and the one or more optical interfaces are facets of the waveguide.

12. The method of claim 11, wherein the facets comprise a partially reflective facet at the operative wavelength.

13. The method of claim 11, wherein the facets comprise a dielectric mirror.

14. The method of claim 11, wherein the waveguide is a ridge waveguide.

15. The method of claim 11, wherein the laser diode comprises a PN junction.

16. The method of claim 1, wherein the one or more optical interfaces include at least one of: a reflective surface, a substrate, a portion of a waveguide, and a layer surface.

17. The method of claim 1, wherein the plurality of optical modes are supported by preferentially reflecting incident light at the operative wavelength in the subset of the plurality of the optical modes compared to incident light at the operative wavelength not in the subset of the plurality of the optical modes.

18. The method of claim 1, wherein the plurality of optical modes are supported by preferentially transmitting incident light at the operative wavelength in the subset of the plurality of the optical modes compared to incident light at the operative wavelength not in the subset of the plurality of the optical modes.

19. The method of claim 1, wherein the plurality of optical modes are supported by preferentially scattering incident light at the operative wavelength in the subset of the plurality of the optical modes compared to incident light at the operative wavelength not in the subset of the plurality of the optical modes.

* * * * *